(12) United States Patent
Staroselsky et al.

(10) Patent No.: US 7,754,035 B2
(45) Date of Patent: Jul. 13, 2010

(54) PREFERENTIAL HARDENING OF SINGLE CRYSTAL BLADES

(75) Inventors: Alexander Staroselsky, Avon, CT (US); Carroll V. Sidwell, Wethersfield, CT (US)

(73) Assignee: United Technologies Corporation, Hartford, CT (US)

( * ) Notice: Subject to any disclaimer, the term of this patent is extended or adjusted under 35 U.S.C. 154(b) by 767 days.

(21) Appl. No.: 11/347,627

(22) Filed: Feb. 3, 2006

(65) Prior Publication Data

US 2010/0108206 A1      May 6, 2010

(51) Int. Cl.
C22F 1/10        (2006.01)
(52) U.S. Cl. .................................. 148/562; 148/677
(58) Field of Classification Search .......... 148/562, 148/675
See application file for complete search history.

(56) References Cited

U.S. PATENT DOCUMENTS

| | | | |
|---|---|---|---|
| 4,392,894 A | | 7/1983 | Pearson et al. |
| 4,514,360 A | | 4/1985 | Giamei et al. |
| 4,677,035 A | * | 6/1987 | Fiedler et al. ............... 428/680 |
| 5,605,584 A | * | 2/1997 | DeLuca et al. ............... 148/410 |

OTHER PUBLICATIONS

Article entitled "Computer Simulation of the Initial Rafting Process of a Nickel-Base Single-Crystal Superalloy", by Feng et al., Metallurgical and Materials Transactions A, vol. 31A, Mar. 2000, pp. 585-597.
Article entitled "Microstructure-based 3D finite element modelling of lattice misfit and long-range internal stresses in creep-deformed nickel-base superalloy single crystals", by Feng et al., Materials Science and Engineering A214, 1996, pp. 1-16.
Article entitled "Creep behaviour of Ni-base single-crystal superalloys with various γ' volume fraction", by Murakumo et al., Acta Materialia 52, 2004, p. 3737-3744.
Article entitled "Rafting in Nickel Based Superalloys", by Bhadeshia, University of Cambridge, Department of Materials Science & Metallurgy, 2003, pp. 1-5.

* cited by examiner

*Primary Examiner*—George Wyszomierski
(74) *Attorney, Agent, or Firm*—Bachman & LaPointe, P.C.

(57) ABSTRACT

A method for improving the strength, creep and failure resistance of a single crystal component, such as a turbine engine component, is provided. The method comprises the steps of forming a component, such as a turbine engine component, having a single crystal microstructure with a plurality of γ' cuboids forming a limited amount of oriented platens in a particular direction prior to the component being placed into service to delay coalescence of the platens relative to the applied load.

15 Claims, 3 Drawing Sheets

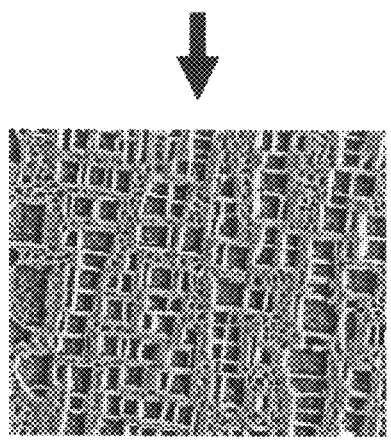
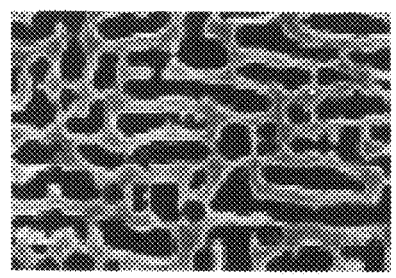
*FIG. 4A*     *FIG. 4B*

PREFERENTIAL HARDENING OF SINGLE CRYSTAL BLADES

BACKGROUND OF THE INVENTION (1) Field of the Invention

The present invention relates to a method of improving the strength and failure resistance of single crystal gas turbine components and to a turbine engine component formed thereby.

(2) Prior Art

Single crystal nickel-based superalloys consist of cuboidal precipitates (known as γ' particles) separated by channels of γ-matrix as shown in FIG. 1. Effectively, the γ' particles and the γ-matrix act as a composite material, where the γ' particles provide strength, while the γ-matrix provides ductility. Under load, the γ' particles tend to coalesce into layers (known as platens). This behavior is shown in FIG. 2. Tensile loading produces layers of γ' that are perpendicular to the applied stress σ, (N-type rafts) while compressive loading produces layers of γ' that are parallel to the applied stress σ (P-type rafts) for negative lattice mismatch. These layered structures are weaker than the original structure and tend to crack at the interface of the γ' platens and the γ-matrix, with cracks propagating along the platens. This behavior is schematically shown in FIG. 3. Under continued loading, these cracks propagate and join with others, eventually resulting in material failure.

SUMMARY OF THE INVENTION

In accordance with the present invention, a method for improving the strength and failure resistance of a single crystal component is provided. The method broadly comprises the steps of forming a component having a single crystal microstructure with a plurality of γ' platens and forming a limited amount of oriented platens in a particular direction prior to the component being placed into service to delay coalescence of the platens relative to the applied load.

Further in accordance with the present invention, a turbine engine component is provided. The turbine engine component broadly comprises a substrate formed from a single crystal nickel based superalloy having a plurality of platens. The platens are pre-oriented in a direction parallel to expected tensile loading prior to the component being put into service.

Still further in accordance with the present invention, a turbine engine component is provided. The turbine engine component broadly comprises a substrate formed from a single crystal nickel based superalloy having a plurality of platens. The platens are pre-oriented in a direction perpendicular to expected compressive loading prior to the component being put into service.

Other details of the preferential hardening of single crystal blades of the present invention, as well as other objects and advantages attendant thereto, are set forth in the following detailed description and the accompanying drawings.

BRIEF DESCRIPTION OF THE DRAWINGS

FIG. 4A is a photomicrograph of a single crystal nickel based superalloy microstructure with intentional pre-orienting of platens under compressive load prior to in-service tensile loading; and FIG. 4B is a photomicrograph of a single crystal nickel based superalloy microstructure under tensile in-service loading after pre-orienting of platens.

DETAILED DESCRIPTION OF THE PREFERRED EMBODIMENT(S)

Figure 1:
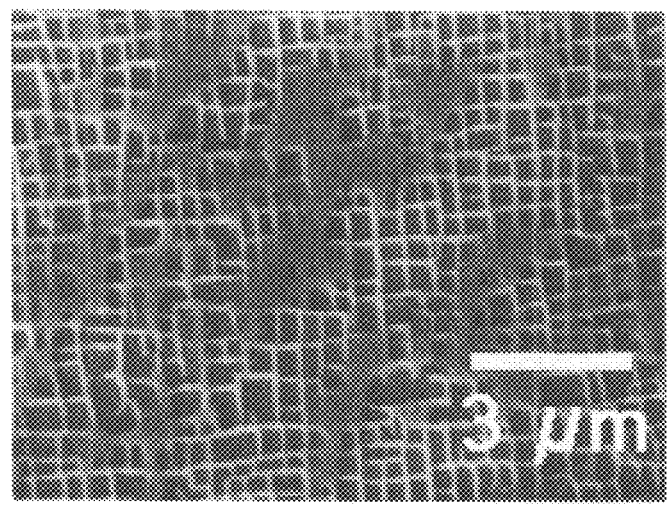
FIG. 1 is a photomicrograph of a prior art single crystal nickel based superalloy microstructure showing γ' particles and γ-matrix.
Figure 2:
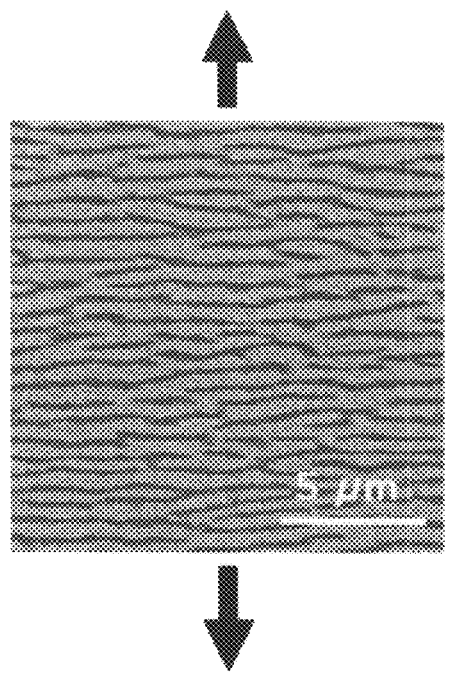
FIG. 2 is a photomicrograph of a prior art single crystal nickel based superalloy microstructure showing coalescence of γ' particles into platens under applied load.
Figure 3:
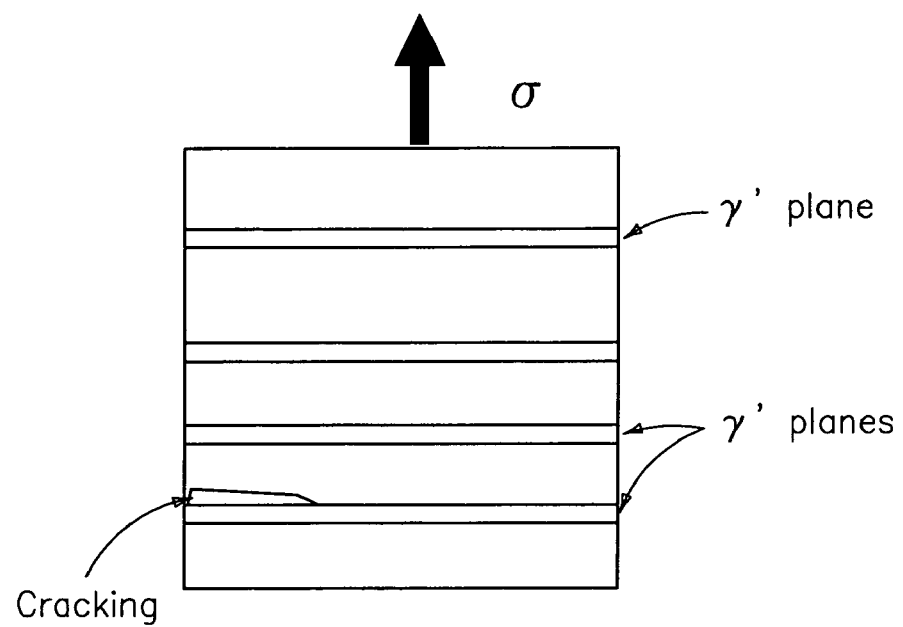
FIG. 3 is a schematic representation of a prior art single crystal nickel based superalloy microstructure under load showing typical crack initiation along γ' platens.

Often, single crystal components require strength in specific directions (the radial direction in blades or the circumferential direction around holes for example). Single crystal alloys exhibit behavior where the tensile strength and crack resistance in a particular direction can be increased if a compressive stress is applied to the component prior to its initial duty loading. The present invention relates to a method of exploiting this behavior to improve the strength of gas turbine components. If the strength of the component can be increased, the life capability of the component is also increased. Increased strength can also allow for lighter-weight components.

In accordance with the present invention, a turbine engine component, such as a turbine blade, a vane, a combustor panel, or a BOAS, is formed from a nickel based superalloy having a microstructure with a plurality of γ' cuboids. The turbine engine component may be formed using any suitable technique known in the art from any suitable single crystal nickel based alloy such as a single crystal nickel based alloy having a composition consisting of from about 2.2 to about 10 wt % chromium, up to about 1.5 wt % titanium, up to about 2.0 wt % molybdenum, from about 4.0 to 5.6 wt % tungsten, up to about 6.4 wt % rhenium, from about 8.4 to about 12 wt % tantalum, from about 5.0 to about 5.7 wt % aluminum, from about 3.3 to about 10 wt % columbium, up to about 0.1 wt % hafnium, and the balance nickel.

In accordance with the present invention, potential damage to the material forming the turbine engine component may be reduced by pre-orienting a limited amount of the platens prior to the beginning of the service life of the turbine engine component. The platens may be pre-oriented in the direction parallel to the tensile loading expected in service or pre-oriented to be perpendicular to expected compressive loads. FIG. 4A shows a single crystal nickel based alloy where the platens have been pre-oriented to be parallel to the expected tensile loading. FIG. 4B shows a single crystal nickel based alloy where the platens have been pre-oriented to be perpendicular to expected compressive loads during service. Pre-orienting the platens will delay the coalescence of platens perpendicular to the applied load, leading to increased material capability.

Deformation of the superalloy forming the turbine engine component is controlled by dislocation movement within γ solid solution and by interaction of dislocations with γ' precipitates. Creep behavior is strongly controlled by orientation and fraction of γ-γ' interfaces in the material. The precipitates evolve from cubes to plate-shaped by a directional coarsening referred to as "rafting." The rafts develop in the early stages of creep at high temperatures, i.e. higher than approximately 1800 degrees Fahrenheit, and at low stress, i.e. about 15 ksi (100 Mpa). The sign and state of imposed stress define the evolution of the precipitate shape. The "inversely rafted" pre-strained component or part has residual stress and strain of opposite sign to the applied ones during the working regime. Pre-strained rafting microstructure is "inverse" to the final rafting microstructure of the single crystal blade after primary creep.

To pre-orient the platens for an expected tensile load, it is necessary to apply a compressive strain to the turbine engine component for a period of time prior to service. The compressive strain can be applied using any suitable technique known in the art. The pre-strain condition could be created using either a mechanical or thermal means or some combination thereof. For example, the component may be heated up to about 1750-1950° F. (not higher in order not to change other microstructural parameters). Mechanical means may be used to generate homogeneous composition along <001> crystallographic direction or homogeneous hoop stress around cooling holes within limits of 15-20 Ksi until the irreversible deformation reaches 0.1-0.2%. Depending on temperature, alloy and applied stress, time to reach the required inelastic strain can be different. The duration and amount of pre-strain should be set to induce a limited amount of directional layering, while not otherwise substantially changing the component's structural capability.

The pre-straining technique may be applied to the entire turbine engine component or locally around features of interest. For example, a turbine blade could be pre-strained with a compressive load along its span to increase its strength under circumferential loading in service. Another example would be the application of a compressive circumferential stress on the inside of a film cooling hole, increasing the hoop strength around the hole.

Preferably, the applied compressive strain is in the range of from about 0.1 to about 0.2%. Depending on temperature, alloy and applied stress, time to reach required inelastic strain can be different.

The turbine engine component materials are subjected to a heat treatment in manufacturing. When a heat treatment is used, it may take place prior to the application of the pre-strain to accelerate the creation of the favorably oriented platens.

During the service loading additional time needed to re-orient the platens to be perpendicular to applied tensile loads (create N-rafts) from pre-oriented due to pre-strain P-rafts, which in turn increases creep resistance and life to rupture. The P-rafted relaxed structure parallel to the tensile direction becomes the most stable against sub-sequential rafting under tension, which increases creep resistance and life to failure.

For high temperature and low stress, the major creep mechanism involves motion of $\gamma$ matrix dislocations and bypassing of $\gamma'$ particles. Pre-strained platen $\gamma'$ raft structure provides additional barriers to matrix dislocation motion and improves creep resistance. Mobility of dislocations is also reduced due to smaller $\gamma$-channel width.

It is apparent that there has been provided in accordance with the present invention a preferential hardening of single crystal blades which fully satisfies the objects, means, and advantages set forth hereinbefore. While the present invention has been described in the context of specific embodiments thereof, other unforeseeable alternatives, modifications, and variations may become apparent to those skilled in the art having read the foregoing description. Accordingly, it is intended to embrace those unforeseeable alternatives, modifications, and variations as fall within the broad scope of the appended claims.

What is claimed is:

1. A method for improving the strength, creep and failure resistance of a single crystal component, said method comprising the steps of:
    forming a component from a nickel based alloy having a chromium content in the range of from 2.2 to 10 wt % and a single crystal microstructure with a plurality of $\gamma'$ platens; and
    forming a limited amount of oriented platens in a particular direction prior to the component being placed into service to delay coalescence of the platens relative to the applied load.

2. A method for improving the strength, creep and failure resistance of a single crystal component, said method comprising the steps of:
    forming a turbine engine component having a single crystal microstructure with a plurality of $\gamma'$ platens;
    forming a limited amount of oriented platens in a particular direction prior to the turbine engine component being placed into service to delay coalescence of the platens relative to the applied load; and
    said platens forming step comprising pre-orienting the platens to be parallel to an expected service tensile load.

3. The method according to claim 2, wherein said component forming step comprises forming the component from a single crystal nickel based superalloy.

4. The method according to claim 2, wherein said pre-orienting step comprises applying a compressive strain to said component for a time period and in a quantity sufficient to induce a limited amount of direction layering while not otherwise changing a structural capability of said component.

5. The method according to claim 4, wherein said compressive strain applying step comprises applying said compressive strain to all of said component.

6. The method according to claim 4, wherein said compressive strain applying step comprises applying said compressive strain locally around features of interest on said turbine engine component.

7. The method according to claim 4, wherein said compressive strain applying step comprises applying said strain via a mechanical device.

8. The method according to claim 2, wherein said platens pre-orienting step comprises using mechanical means to generate homogeneous composition along a <001> crystallographic direction until irreversible deformation reaches 0.1 to 0.2%.

9. A method for improving the strength, creep and failure resistance of a single crystal component, said method comprising the steps of:
    forming a component from a nickel based alloy having a chromium content in the range of from 2.2 to 10 wt % and a single crystal microstructure with a plurality of $\gamma'$ platens;
    forming a limited amount of oriented platens in a particular direction prior to the component being placed into service to delay coalescence of the platens relative to the applied load; and
    said platens forming step comprising applying heat at a temperature in the range of from about 1750 to 1950° F. and applying a pre-strain force to the component until irreversible strain reaches 0.1 to 0.2%.

10. A method for improving the strength, creep and failure resistance of a single crystal component, said method comprising the steps of:
    forming a turbine engine component having a single crystal microstructure with a plurality of $\gamma'$ platens;
    forming a limited amount of oriented platens in a particular direction prior to the turbine engine component being placed into service to delay coalescence of the platens relative to the applied load; and
    said platens forming step comprising pre-orienting the platens to be perpendicular to an expected service load.

11. The method according to claim 10, wherein said pre-orienting step comprises applying a compressive strain to said component for a time period and in a quantity sufficient to induce a limited amount of direction layering while not otherwise changing a structural capability of said component.

12. The method according to claim 11, wherein said compressive strain applying step comprises applying said compressive strain to all of said component.

13. The method according to claim 11, wherein said compressive strain applying step comprises applying said compressive strain locally around features of interest.

14. The method according to claim 11, wherein said compressive strain applying step comprises applying said strain via a mechanical device.

15. A method for improving the strength, creep and failure resistance of a single crystal component, said method comprising the steps of:

forming a turbine engine component having a single crystal microstructure with a plurality of γ' platens;

forming a limited amount of oriented platens in a particular direction prior to the turbine engine component being placed into service to delay coalescence of the platens relative to the applied load;

said platens forming step comprising pre-orienting the platens to be parallel to an expected service tensile load; and said platens pre-orienting step comprising using mechanical means to generate homogeneous hoop stress around cooling holes of said turbine engine component within limits of 15-20 ksi until an irreversible deformation reaches 0.1 to 0.2%.

* * * * *